(12) United States Patent
Yamamoto et al.

(10) Patent No.: US 7,615,281 B2
(45) Date of Patent: Nov. 10, 2009

(54) RADIO WAVE ABSORBING COATING COMPOSITION AND COATED OBJECT THEREWITH

(75) Inventors: Toshifumi Yamamoto, Saitama (JP); Hiroaki Watanabe, Saitama (JP); Satoshi Ogino, Kawasaki (JP); Takashi Takagai, Kawasaki (JP)

(73) Assignees: Fujikura Kasei Co., Ltd., Tokyo (JP); Microwave Absorbers Inc.

( * ) Notice: Subject to any disclaimer, the term of this patent is extended or adjusted under 35 U.S.C. 154(b) by 246 days.

(21) Appl. No.: 11/426,107

(22) Filed: Jun. 23, 2006

(65) Prior Publication Data
US 2007/0003757 A1   Jan. 4, 2007

(30) Foreign Application Priority Data
Jun. 28, 2005   (JP) .............................. 2005-188408

(51) Int. Cl.
*B32B 5/16*   (2006.01)
*C08K 3/04*   (2006.01)

(52) U.S. Cl. ...................... 428/328; 428/323; 428/332; 428/334; 428/339; 524/440; 524/495

(58) Field of Classification Search ...................... None
See application file for complete search history.

(56) References Cited

U.S. PATENT DOCUMENTS 2,951,246 A * 8/1960 Halpern et al. ................. 342/1
6,436,470 B1 * 8/2002 Iacocca et al. .............. 427/201

FOREIGN PATENT DOCUMENTS

JP          107867      1/1998

* cited by examiner

*Primary Examiner*—Monique R Jackson
(74) *Attorney, Agent, or Firm*—Wood, Herron & Evans, L.L.P.

(57) ABSTRACT

A radio wave absorbing coating composition that exhibits an excellent absorption performance of radio waves in 40 MHz to 3 GHz frequency band is provided. The radio wave absorbing coating composition contains metal powder that is made up of a martensitic Fe—Cr—Ni alloy powder and/or a martensitic Fe—Ni alloy powder, carbon powder, resin, and solvent.

7 Claims, 7 Drawing Sheets

RADIO WAVE ABSORBING COATING COMPOSITION AND COATED OBJECT THEREWITH

BACKGROUND OF THE INVENTION

1. Field of the Invention

The present invention relates to a radio wave absorbing coating composition and to a coated object that is obtained using this radio wave absorbing coating composition.

Priority is claimed on Japanese Patent Application No. 2005-188408, filed Jun. 28, 2005, the contents of which are incorporated herein by reference.

2. Description of Related Art

In recent years, high-speed information processing has been demanded in electronic instruments for personal digital assistants such as personal computers, mobile telephones, and digital cameras. In order to meet these demands, clock frequencies that operate a circuit has been increasing, and accordingly electromagnetic wave radiations are tend to be generated easily from circuit modules and transmission paths.

Moreover, there have also been demands for size reductions in electronic instruments for personal digital assistants, and higher circuit packaging densities have been sought in conjunction with these demands. As a result, signal interference that is caused by electromagnetic wave noise between circuits tends to be generated easily. Generation of this type of electromagnetic radio wave noise affects other instruments located around the electronic instruments for personal digital assistants, and there is also a possibility that normal usage of the electronic instruments for personal digital assistants themselves might be interrupted.

Accordingly, suppressing of electromagnetic wave radiation to outside from these instruments and suppressing of electromagnetic wave noise inside the instruments are significant problems in electronic instruments for personal digital assistants.

In Japanese Unexamined Patent Application, First Publication No. H10-7867, a description is given how the radio wave absorption properties are obtained in 1 to 18 GHz frequency band by employing a structure in which a bottom layer film is formed on an iron plate using a liquid composition that contains a nickel-zinc based spinel type ferrite sintered powder and a resin, and a top layer is formed thereon by coating a slurry composition that is obtained by kneading a cement mortar into a liquid composition that contains a graphite carbon ultrafine powder and a resin.

However, with a structure as described in Japanese Unexamined Patent Application, First Publication No. H10-7867, there has been insufficient absorption performance for radio waves in 40 MHz to 3 GHz frequency band which causes most of the problems in electromagnetic wave radiations to outside from electronic instruments for personal digital assistants, and in electromagnetic wave noise inside the electronic instruments for personal digital assistants.

The present invention was conceived in view of the above described circumstances and it is an objective thereof to provide a radio wave absorbing coating composition that provides an excellent absorption performance of radio waves in 40 MHz to 3 GHz frequency band and also a coated object that is formed by using the radio wave absorbing coating composition.

SUMMARY OF THE INVENTION

In order to achieve the above described objectives, the radio wave absorbing coating composition of the present invention contains metal powder that is made up of a martensitic Fe—Cr—Ni alloy powder and/or a martensitic Fe—Ni alloy powder, carbon powder, resin, and solvent.

Moreover, the present invention also provides a coated object having a coating film that is formed using the radio wave absorbing coating composition of the present invention.

According to the radio wave absorbing coating composition of the present invention, it is possible to form a coating film having excellent radio wave absorption properties in 40 MHz to 3 GHz frequency band.

According to the present invention, it is possible to obtain a coated object that is provided with a coating film that has excellent radio wave absorption properties in 40 MHz to 3 GHz frequency band.

DETAILED DESCRIPTION OF THE INVENTION (Radio Wave Absorbing Coating Composition)

[Metal Powder]

In the present invention, a martensitic Fe—Cr—Ni alloy powder and/or a martensitic Fe—Ni alloy powder are used for the metal powder.

The martensitic Fe—Cr—Ni alloy of the present invention employs Fe, Cr, and Ni as its principal alloy elements, and may also contain alloys in which small quantities of metals other than these are contained. Specifically, a commercially available martensitic stainless steel powder can be used as the martensitic Fe—Cr—Ni alloy powder. The average particle diameter is preferably 5 to 100 µm and more preferably 15 to 40 µm.

Commercially available martensitic Permalloy (registered trademark) powder can be used as the martensitic Fe—Ni alloy powder. The Fe—Ni alloy of the present invention is generally a soft magnetic alloy that is known as a Permailoy, and may also contain Permalloy that have small quantities of other metals such as Mo, Cr, and Mn added thereto. The average particle diameter is preferably 5 to 100 µm and more preferably 15 to 40 µm.

It is possible to use a martensitic Fe—Cr—Ni alloy powder solely as the metal powder, and it is also possible to use a martensitic Fe—Ni alloy powder solely as the metal powder.

In addition, the same type of effects can be obtained if a combination of a martensitic Fe—Cr—Ni alloy powder and a martensitic Fe—Ni alloy powder is used.

The metal powder that is used in the present invention is preferably a flat powder in which the particle shape is flat.

The flattening is preferably within a range of approximately 20 to 50 by using a product of the average particle size $D_{50}$ (μm) of the powder and the specific surface area (m$^2$/gr) of the powder as an approximate value.

By using a flat metal powder, it is possible to improve even further the radio wave absorption performance that is obtained by using the radio wave absorbing coating composition of the present invention. If the flattening of the metal powder exceeds the above described range, it is not preferable as it makes particles tend to break easily during mixing.

In the radio wave absorbing coating composition of the present invention, it is preferable that the metal powder contained therein is in a range of 100 to 400 parts by mass, and more preferably in a range of 150 to 350 parts by mass when the resin (a solid component portion) is contained 100 parts by mass. If the content of the metal powder is too small, then an excellent radio wave absorption performance cannot be obtained, while it is difficult to form an excellent coating film if the content is too large.

[Carbon Powder]

In the present invention, by using a combination of the above described metal powder and a carbon powder, it is possible to suppress the reflection of radio waves by the metal powder and thereby obtain an excellent radio wave absorption performance.

Carbon black and graphite powder are favorably used as the carbon powder. In order to further improve the radio wave absorption performance in 40 MHz to 3 GHz frequency band, it is preferable that at least carbon black powder is used, and it is preferable that the carbon black powder is solely used or that a mixture of carbon black powder and graphite powder is used.

The average particle diameter of the carbon black powder is preferably 10 to 100 nm, and more preferably 15 to 40 nm.

The average particle diameter of the graphite powder is preferably 1 to 50 μm and more preferably 3 to 10 μm.

In the radio wave absorbing coating composition of the present invention, it is preferred that the carbon powder is contained in a range of 5 to 40 parts by mass, and more preferably in a range of 15 to 35 parts by mass in mass when the resin is contained 100 parts by mass. If the content of the carbon powder is too small, then an excellent radio wave absorption performance cannot be obtained, while it is difficult to form an excellent coating film if the content is too large.

When a mixture of carbon black powder and graphite powder is used as the carbon powder, the mixing ratio of the two (i.e., carbon black powder: graphite powder) is preferably in a range from 90:10 to 20:80 in mass.

[Resin]

The resin that is used in the present invention is not particularly restricted provided that it has film forming capabilities. The resin may be a thermoplastic resin or a thermosetting resin. Specific examples of the resin contain polyester resins, urethane resins, acrylic resins, epoxy resins, phenol resins, alkyd resins, butyral resins, or chlorinated polypropylene and the like. The resin may be a single type of resin or may be a mixture of two or more types of resin.

Among these, as the urethane resin, polyester based urethane resins, polyether based urethane resins, polycarbonate based urethane resins, or acrylic resin based urethane resins are preferable in view of the film strength and adhesiveness thereof. Moreover, emulsion of these may be even more preferably used from environmental point of view.

[Solvent]

The radio wave absorbing coating composition of the present invention can be manufactured by mixing metal powder, carbon powder, resin, and solvent together.

The solvent may be selected from suitable known solvents provided that they are able to uniformly dissolve or disperse the constituent components such as metal powder, carbon powder or resin and the like. Specific examples of the solvent contain alcohol based solvents such as ethanol, ester based solvents such as ethyl acetate, ketone based solvents such as methyl ethyl ketone, aromatic based solvents such as toluene, or water and the like. The solvent may be a single type of solvent or may be a mixture of two or more types of solvents.

The amount of solvent that is used is not particularly restricted but may be suitably set such that the desired film thickness is obtained by a coating method, which is employed, with a solid component density with which the coating can be performed.

[Other Components]

In addition to the above described component elements, other components such as antioxidants, anticorrosive, dispersing agents, or anti-settling agents and the like can be suitably added arbitrarily to the radio wave absorbing coating composition of the present invention.

(Coated Object)

The coated object of the present invention is obtained by coating the radio wave absorbing coating composition of the present invention onto a work and implementing drying processing arbitrarily so as to form a coating film.

When the thickness of the coating film is too thin, then satisfactory radio wave absorption performance can not be obtained. On the other hand, when the thickness of the coating film is too thick, although the radio wave absorption performance improves, there are risks that the adhesiveness or the coating film might deteriorate and deformation of the base material might occur. Accordingly, a preferable film thickness for the coating film is approximately 30 to 150 μm and more preferable 50 to 100 μm.

Coating methods to form the radio wave absorbing coating composition are not particularly restricted but print coating, spray coating, gravure coating, immersion coating, or roller coating and the like may be used. Spray coating is preferably used since surfaces with complicated configurations can be easily coated. If spray coating is performed, the viscosity of the coating is preferably within a range of 20 ±10 seconds when the drop time is measured by IWATACUP NK-II viscometer at 23° C.

The coated object is not particularly restricted and the radio wave absorbing coating composition of the present invention can be coated onto desired locations of various electronic instruments for personal digital assistants. The coated surfaces can be flat or curved. Specific examples of coated objects on which a coating film can be formed contain mobile telephones, digital cameras, DVDs, or small personal computers and the like, and the coating is performed, for example, onto components and housings of these instruments.

According to the radio wave absorbing coating composition of the present invention, a coating film that has an excellent radio wave absorption performance in 40 MHz to 3 GHz frequency band can be obtained. Accordingly, by coating the radio wave absorbing coating composition of the present invention onto suitable locations such as, for example, close to a source of the unnecessary radio waves in electronic instruments for personal digital assistants, then electromagnetic wave radiation to outside from electronic instruments for personal digital assistants and electromagnetic wave noise inside the electronic instruments for personal digital assistants can be efficiently suppressed.

Here, Table 1 also shows the ratio in mass of the metal powder and the carbon powder (sum of the carbon black powder and the graphite powder) compared to 100 in mass of the resin solid component.

Urethane resin: manufactured by ASAHI DENKA Co., Ltd.(currently ADEKA CORPORATION), product name; Adeka-Bontighter-HUX-386, resin solid component content 30 percent in mass.
Permalloy powder: manufactured by SINZEN Co.,Ltd., product name; KDPB-3, average particle diameter; 40 μm, flattening 48.
Stainless steel powder: manufactured by NiPPON YAKri KOGYO CO.,LTD., product name; FJSU-1, average particle diameter; 30 μm, flattening 25.
Carbon black powder: manufactured by DEGUSSA AG, product name Printex L, average particle diameter; 23 nm.
Graphite powder: manufactured by CHUETSU GRAPHITE WORKS CO.,LTD., product name; BF-5A, average particle diameter; 5 μm.

TABLE 1

| | Sample No. | | | | | | |
| --- | --- | --- | --- | --- | --- | --- | --- |
| | 1 | 2 | 3 | 4 | 5 | 6 | 7 |
| Urethane resin | 83.3 | 83.3 | 83.3 | 100 | 106.7 | 83.3 | 100 |
| (resin solid component quantity) | (25) | (25) | (25) | (30) | (32) | (25) | (30) |
| Permalloy powder | 72 | 68 | — | — | — | 75 | — |
| Stainless steel powder | — | — | 72 | 70 | 68 | — | 70 |
| Carbon black powder | 1.8 | 2.8 | 1.2 | 2.5 | 4.2 | — | — |
| Graphite powder | 1.2 | 4.2 | 1.8 | 2.5 | 2.8 | — | — |
| Ethanol | 9.5 | 22.1 | 29.5 | 35.8 | 42.1 | — | 30 |
| Total | 167.8 | 180.4 | 187.8 | 210.8 | 223.8 | 158.3 | 200 |
| Resin/ metal powder/ carbon powder | 100/ 288/ 12 | 100/ 272/ 28 | 100/ 288/ 12 | 100/ 233/ 17 | 100/ 213/ 22 | 100/ 300/0 | 100/ 233/0 |

Moreover, it is possible to easily form a film on coating surfaces that have complicated configurations, and thereby it is possible to impart radio wave absorption properties thereto.

EXAMPLES

The present invention will now be described specifically using examples.

Test Samples 1 to 7

Test samples 1 to 7 of a radio wave absorbing coating composition were manufactured by mixing a resin, metal powder, carbon powder, and a solvent using dispersion mixer in the proportions as shown in Table 1. No. 6 and 7 were reference samples that did not contain carbon powder The unit of the mixing quantities shown in Table 1 is part by mass.

The urethane resin described below was used for the resin, the Permalloy powder and the stainless steel powder described below were used for the metal powder; the carbon black powder and the graphite powder described below were used for the carbon powder, and ethanol was used for the solvent.

Test Sample 8

For the reference sample (Test sample No. 8), a commercially available radio wave absorbing coating which uses spinel type ferrite (manufactured by TODA KOGYO CORP., product name; BSF-029) was used for the metal powder.

Examples 1A to 5B, Reference samples 1 to 3

In Examples 1A to 5B and Reference samples 1 to 3, coating films having the film thicknesses shown in Table 2 were formed using the coating compositions of Test samples 1 to 8 as shown in Table 2. The transmission loss was then measured in these coating films using a microstripline method. The larger the value of the transmission loss is, the better the radio wave absorption performance becomes.

Here, in Test sample 8, when the film thickness was approximately 100 μm, the value for the transmission loss was too small to measure, therefore the film thickness was set to be 300 μm.

TABLE 2

|  | Example | | | | | | | | | | Reference Samples | | | |
| --- | --- | --- | --- | --- | --- | --- | --- | --- | --- | --- | --- | --- | --- | --- |
|  | 1A | 1B | 2A | 2B | 3A | 3B | 4A | 4B | 5A | 5B | 1 | 2A | 2B | 3 |
| Film thickness (μm) | 58 | 103 | 53 | 102 | 55 | 104 | 56 | 103 | 55 | 105 | 60 | 53 | 105 | 300 |
| Sample No. | 1 | | 2 | | 3 | | 4 | | 5 | | 6 | 7 | | 8 |

Figure 1:
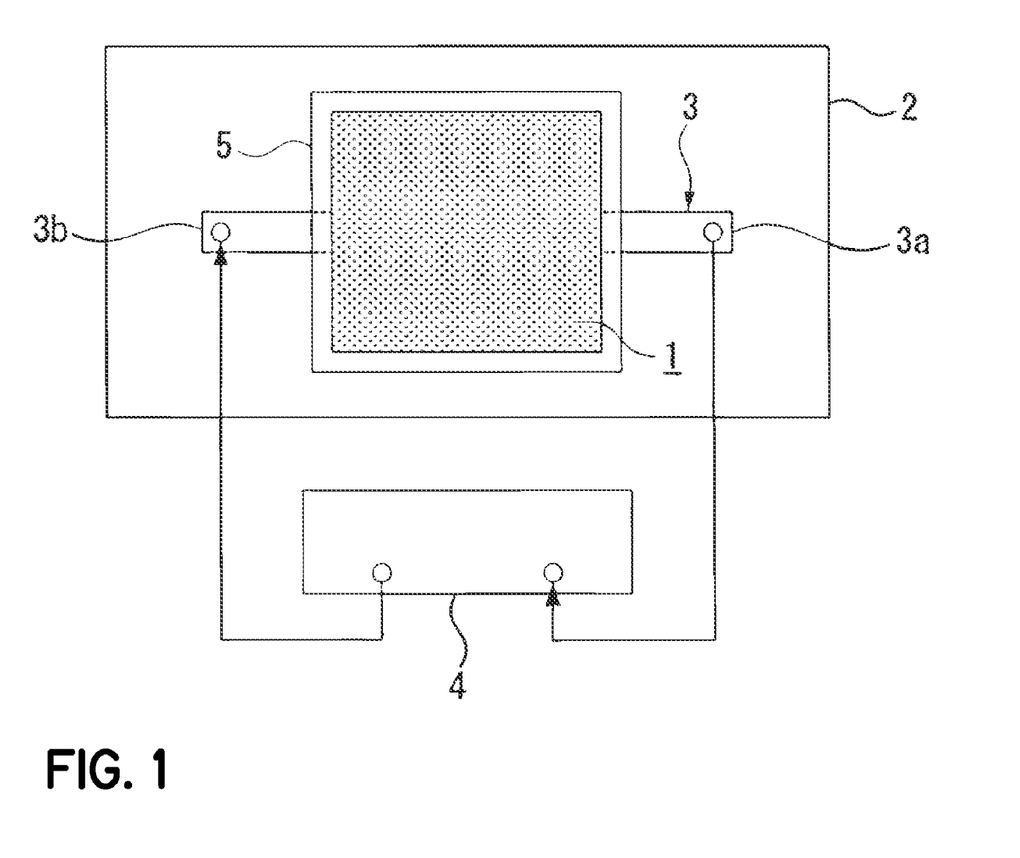
FIG. 1 is a plan view showing an example of a device that measures radio wave absorption performance according to an embodiment of the present invention.
Figure 2:
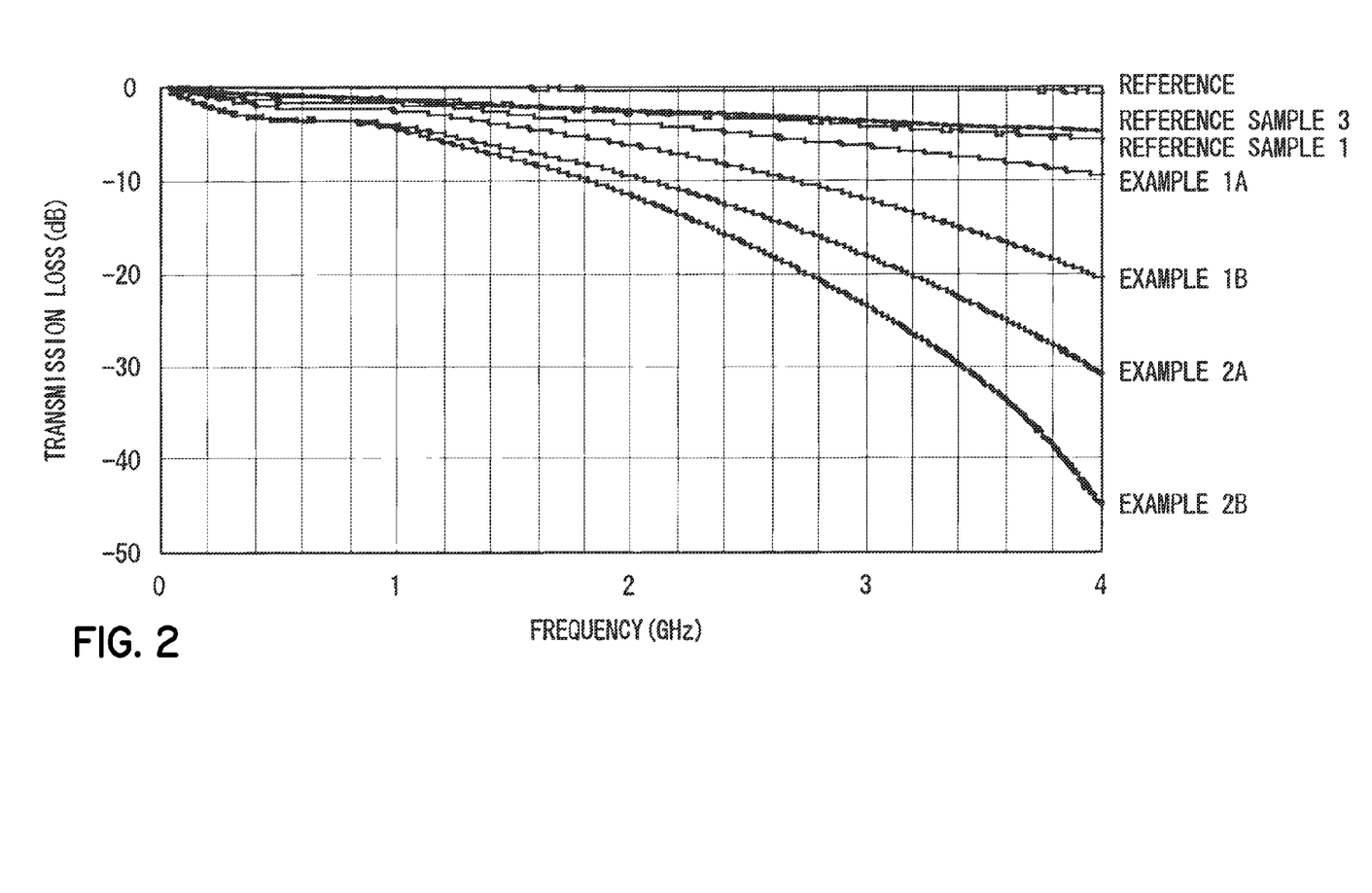
FIG. 2 is a graph showing measurement results of the radio wave absorption performance according to an embodiment and a reference sample of the present invention.

FIG. 1 is a schematic structural illustration of a measurement device. This device is constituted such that a microstripline 3, which is made of a copper foil having an impedance of 50Ω, is formed on a fluoride resin substrate 2 and an AC voltage is applied by a network analyzer 4 between two terminals 3a and 3b of the microstripline 3.

When a measurement is made, a coating film 1, which is to be measured, is formed on a non-conductive thin film sheet 5 and the non-conductive thin film sheet 5 is tightly adhered onto the microstripline 3. In this state, an AC voltage of a predetermined frequency is applied between the two terminals 3a and 3b of the microstripline 3, and changes in the transmission characteristics (i.e., the transmission loss) of the microstripline 3 are measured.

The transmission loss was measured while the frequency of the AC voltage, which was applied between the two terminals 3a and 3b of the microstripline 3, was changed continuously from 40 MHz to 4 GHz.

In addition, in order to provide a reference, the transmission loss was measured on the same condition except that the coating film was not formed on the non-conductive thin film sheet 5.

Figure 3:
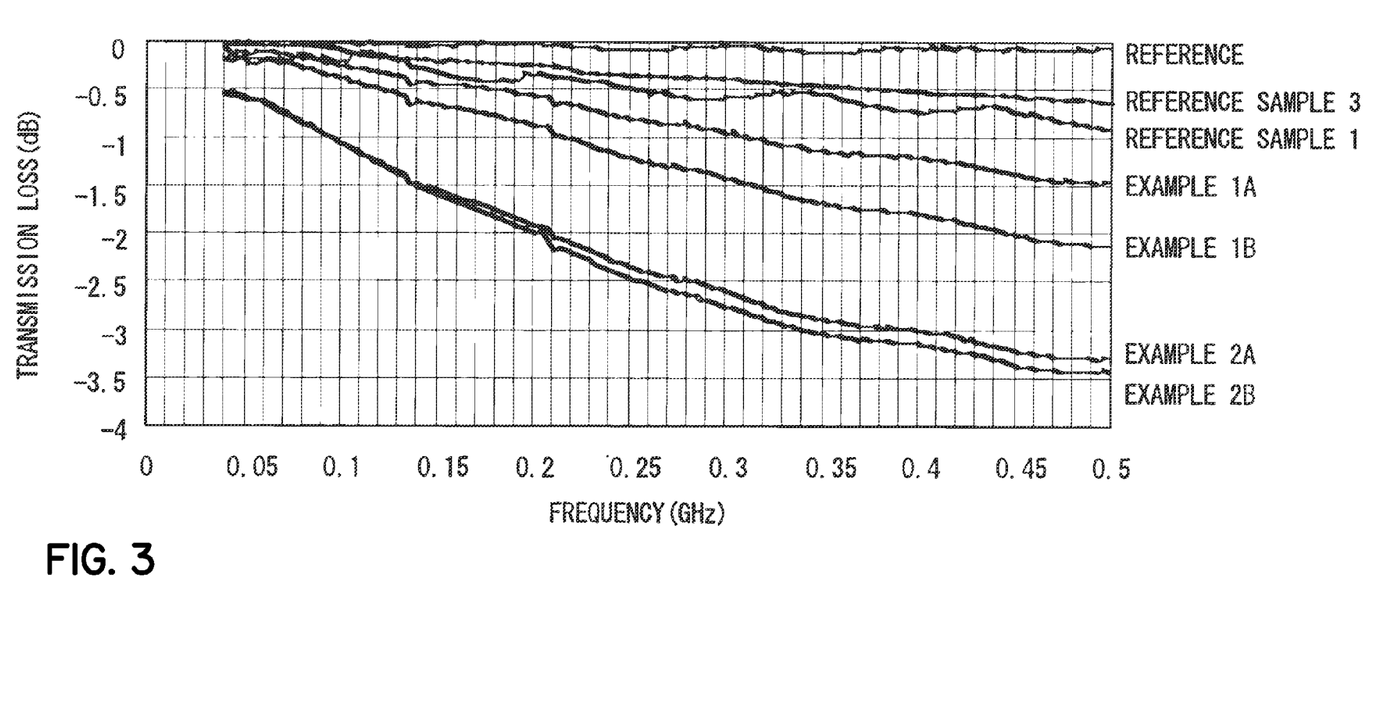
FIG. 3 is a graph showing an enlargement of a portion of the graph in FIG. 2.
Figure 4:
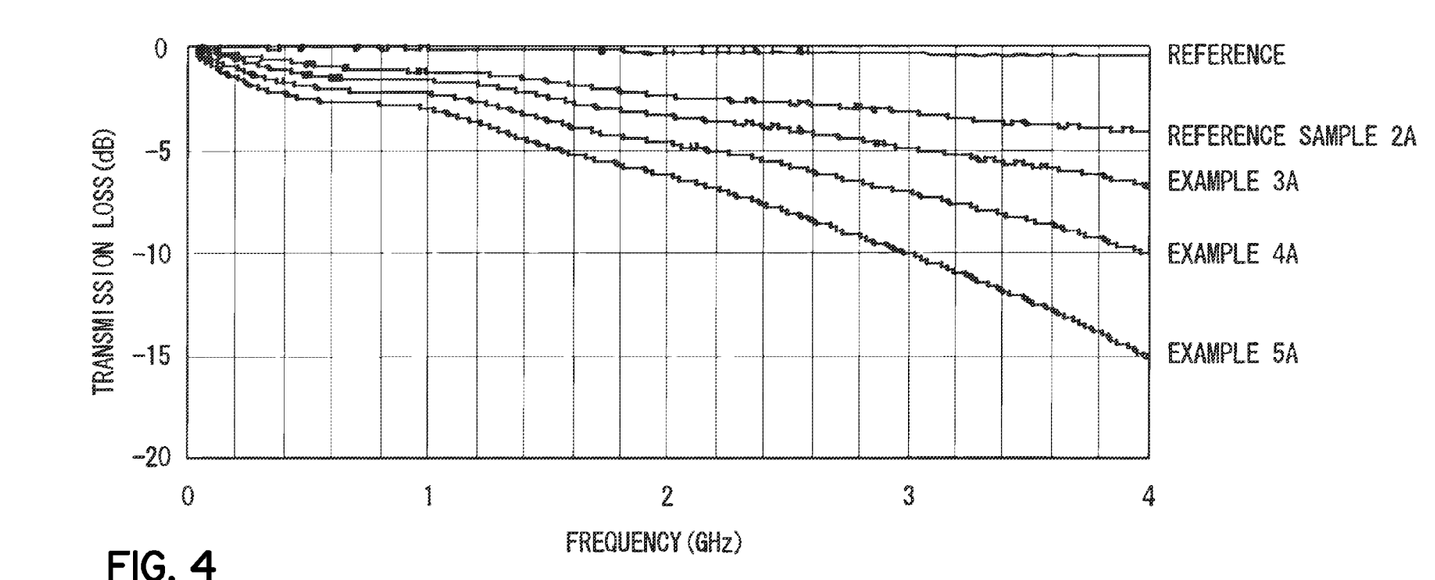
FIG. 4 is a graph showing measurement results of the radio wave absorption performance according to an embodiment and a reference sample of the present invention.
Figure 5:
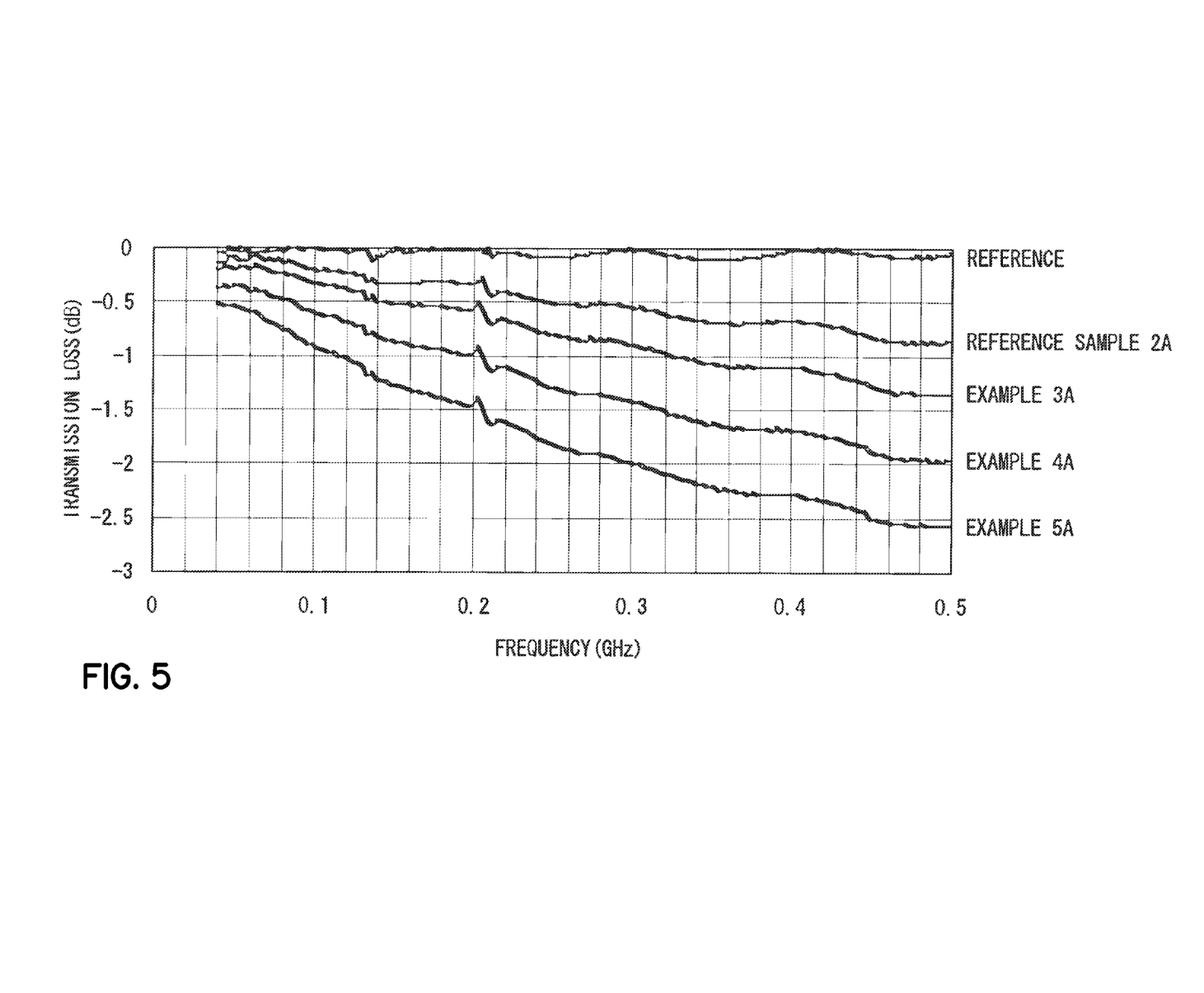
FIG. 5 is a graph showing an enlargement of a portion of the graph in FIG. 4.
Figure 6:
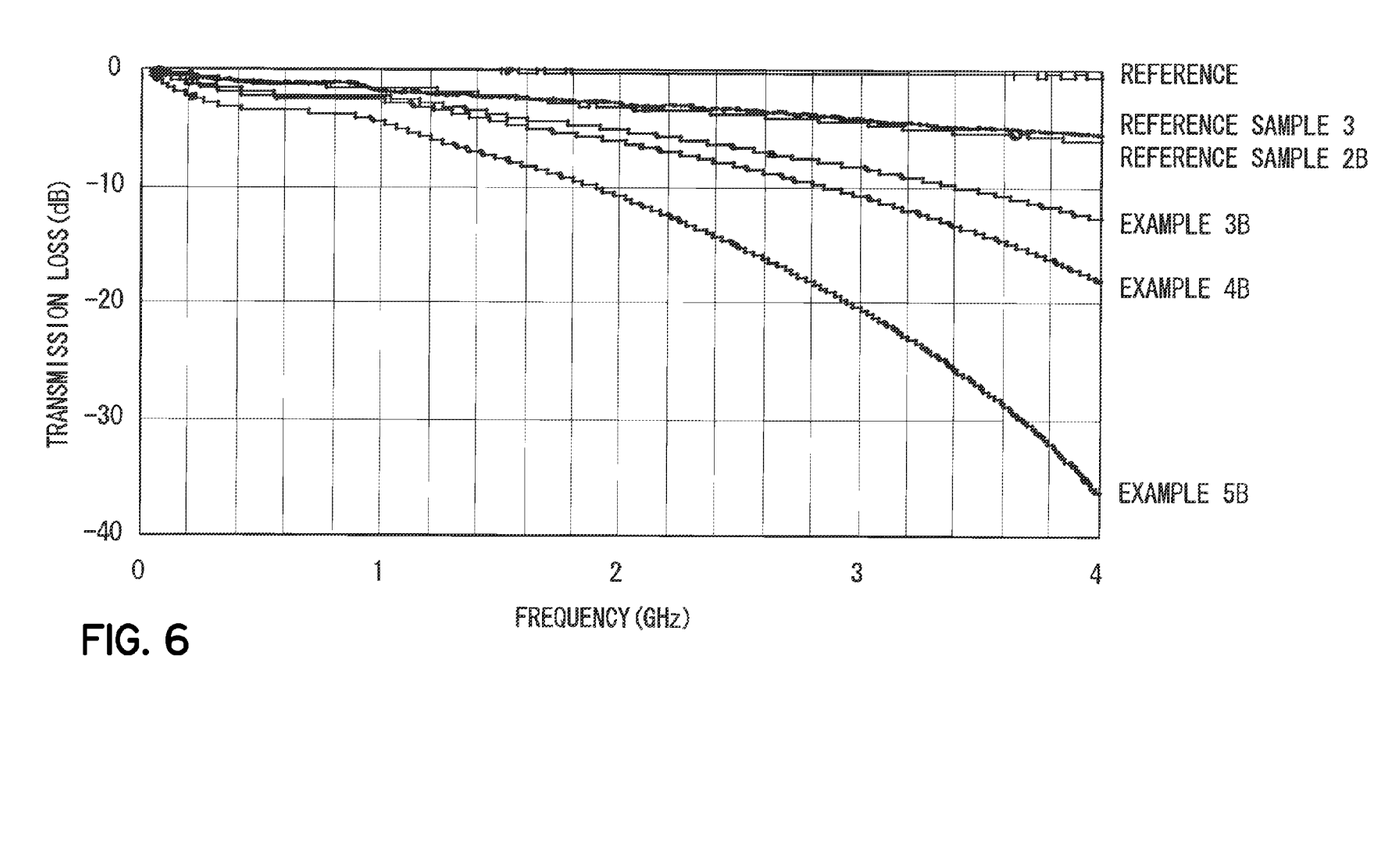
FIG. 6 is a graph showing measurement results of the radio wave absorption performance according to an embodiment and a reference sample of the present invention.
Figure 7:
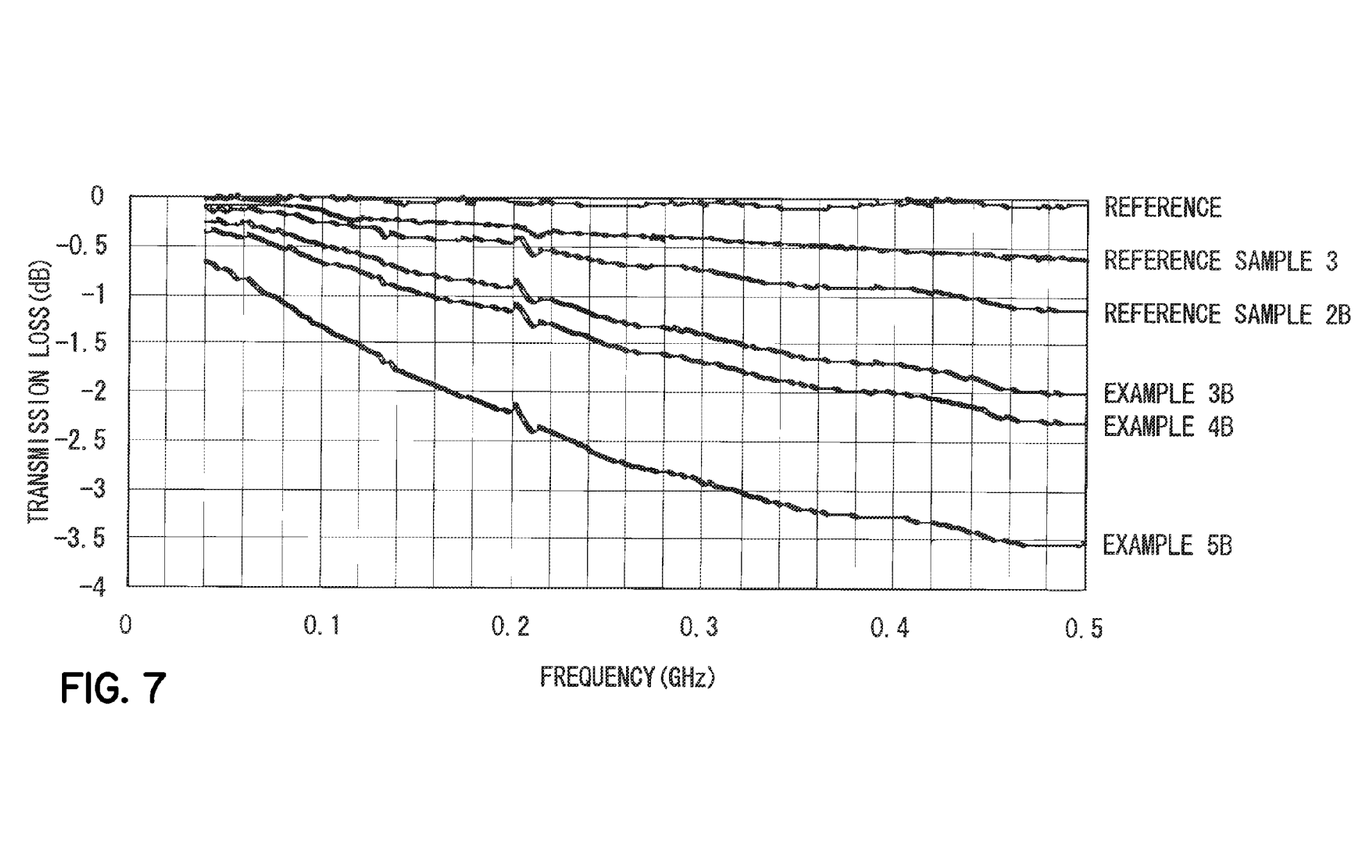
FIG. 7 is a graph showing an enlargement of a portion of the graph in FIG. 6.

The measurement results thereof are shown in FIGS. 2 to 7. FIGS. 3, 5, and 7 are enlargements of portions (i.e., 40 MHz to 0.5 GHz) of the graphs shown in FIGS. 2, 4, and 6 respectively. The transmission losses shown in these graphs are relatively shown taking the transmission loss of the reference as a reference.

From the measurement results shown in FIGS. 2 to 7, radio wave absorption performances of the Examples 1A to 5B are improved compared with those of the reference samples 1 to 3.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A radio wave absorbing coating composition that contains metal powder that is made up of a martensitic Fe—Cr—Ni alloy powder having an average particle diameter of 15 to 40 μm and/or a martensitic Fe—Ni alloy powder having an average particle diameter of 15 to 40 μm, carbon powder, resin, and solvent,
    wherein a content of the metal powder is in a range of 100 to 400 parts by mass and a content of the carbon powder is in a range of 5 to 40 parts by mass in comparison with 100 parts by mass of the resin,
    and the carbon powder contains carbon black and graphite powder.

2. The radio wave absorbing coating composition according to claim 1, wherein a ratio of carbon black and graphite powder in the carbon powder is in a range of 2:3 to 3:2 in mass.

3. The radio wave absorbing coating composition according to claim 1, wherein the metal powder is a flat powder.

4. A coated object provided with a coating film that is formed using the radio wave absorbing coating composition according to claim 1.

5. A coated object provided with a coating film that is formed using the radio wave absorbing coating composition according to claim 3.

6. The coated object according to claim 4, wherein a film thickness of the coating film is 30 to 150 μm.

7. The coated object according to claim 5, wherein a film thickness of the coating film is 30 to 150 μm.

* * * * *